United States Patent [19]

Nakata

[11] 4,117,505
[45] Sep. 26, 1978

[54] THYRISTOR WITH HEAT SENSITIVE SWITCHING CHARACTERISTICS

[75] Inventor: Josuke Nakata, Itami, Japan

[73] Assignee: Mitsubishi Denki Kabushiki Kaisha, Tokyo, Japan

[21] Appl. No.: 743,356

[22] Filed: Nov. 19, 1976

[51] Int. Cl.² .................. H01L 23/56; H01L 29/66; H01L 29/74

[52] U.S. Cl. .................. 357/28; 357/38; 357/64; 307/310

[58] Field of Search .................. 357/28, 64, 86, 38; 307/310

[56] References Cited

U.S. PATENT DOCUMENTS

| 3,445,735 | 5/1969 | Desmond et al. | 357/64 |
| 3,487,276 | 12/1969 | Wolley | 357/64 |
| 3,727,116 | 4/1973 | Thomas et al. | 357/64 |
| 3,943,013 | 3/1976 | Kennedy et al. | 357/64 |
| 3,962,692 | 6/1976 | Murphy et al. | 357/64 |

*Primary Examiner*—Andrew J. James
*Attorney, Agent, or Firm*—Oblon, Fisher, Spivak, McClelland & Maier

[57] ABSTRACT

A heat sensitive switching device comprises at least three pn junctions between a pair of main electrodes to change from the OFF state to the ON state under rising temperature in at least one quadrant of the main voltage - main current characteristic curve wherein a region for shortening the life-time of carriers is formed at a part of the pn junction which causes the reverse bias in the OFF state.

7 Claims, 4 Drawing Figures

THYRISTOR WITH HEAT SENSITIVE SWITCHING CHARACTERISTICS

BACKGROUND OF THE INVENTION

1. Field of the Invention

The present invention relates to a heat sensitive switching device which turns on at higher than the specific temperature.

2. Description of the Prior Art

A thyristor having pnpn junctions has been known as means for switching from the OFF state to the ON state by a specific electrical or optical signal.

These conventional thyristors can be used only in a range of the temperature to prevent the lowering of the OFF voltage caused by rising junction temperature or to prevent the turn-on caused by heating.

The heat sensitive switching device of the invention is a switch which changes from the OFF state to the ON state when the temperature rises over the specific temperature.

The temperature to extinguish the OFF state by raising the temperature is higher than the rated maximum junction temperature defined for the conventional thyristors. Accordingly, the conventional thyristor has been difficult to switch at relatively low temperature because it has been required to increase the applicable power limit (or allowable loss) and accordingly, the conventional thyristor has been formed to maintain the OFF voltage at a temperature as high as possible.

SUMMARY OF THE INVENTION

It is an object of the present invention to provide a heat sensitive switching device in which the OFF voltage is suddenly decreased at relatively lower temperature to extinguish the OFF state which is opposite to that of the conventional thyristor.

The object of the present invention has been attained by providing a heat sensitive switching device which comprises at least three pn junctions between a pair of main electrodes to change from the OFF state to the ON state under rising the temperature in at least one quadrant of the main voltage - the main current characteristic curve wherein a region for shortening the lifetime of carriers is formed at a part of the pn junction which causes the reverse bias in the OFF state.

The heat sensitive switching device preferably has the region for shortening the lifetime of carriers on the surface of the pn junctions.

The region for shortening the lifetime of carriers can be formed by a diffusion of lifetime carriers such as gold, copper or iron.

The region for shortening the lifetime of carriers can be formed by a high energy radiation of X-rays, γ-rays or electron rays.

DETAILED DESCRIPTION OF THE PREFERRED EMBODIMENTS

Figure 1:
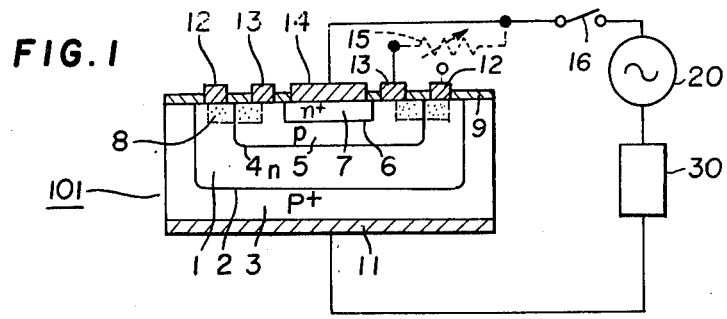
FIG. 1 is a circuit diagram for illustrating one embodiment of the heat sensitive switching device according to the invention.

Referring to the drawings especially FIG. 1, one embodiment of the present invention will be illustrated.

In FIG. 1, a pnpn heat sensitive switching device 101 has pnpn junctions formed by sequentially diffusing a p-type impurity and an n-type impurity from the specific surfaces of the substrate such as an n-type silicon wafer.

The heat sensitive switching device comprises an n-type base layer 1 which is the silicon substrate; a p-type emitter layer 3 which is formed by diffusing an impurity into the n-type silicon substrate; a p-type base layer 5 which is formed by diffusing an impurity into the n-type silicon subtrate; an n-type emitter layer 7 which is formed by diffusing an impurity into the p-type base layer; a first emitter junction 2 which is formed by the n-type base layer 1 and the p-type emitter layer 3; a collector junction 4 which is formed by the n-type base layer 1 and the p-type base layer 5; and a second emitter junction 6 which is formed by the p-type base layer 5 and the n-type emitter layer 7.

The ends of pn junctions 2, 4, 6 have the planar structure meeting with the main surface in the same side of the n-type emitter layer 7. The surfaces (ends) of the pn junctions are protected with a silicon oxide membrane 9 etc.

The region shown by the dotted line across the collector junction 4 is a short lifetime region 8 which is formed by diffusing gold from the surface. The lifetime of the carriers in the short lifetime region 8 is shorter than that of the other region for forming the collector junction 4 (inner region for major collector junction), whereby the current for generating under the reverse bias is large. This is a characteristic feature.

The function and effect of the region will be illustrated below.

After forming the above-mentioned layers, the separated electrodes are formed on each region by vapor-depositing a metal on both of the surfaces and photoetching and sintering it.

In FIG. 1, a first main electrode 11 is brought into low resistance contact with the p-type emitter layer 3 and a first base electrode 12 is brought into low resistance contact with the n-type base layer 1 and a second base electrode 13 is brought into low resistance contact with the p-type base layer 5 and a second main electrode 14 is brought into low resistance contact with the n-type emitter layer 7.

In FIG. 1, only one pnpn heat switching device 101 is shown. However, many elements are formed in one large silicon wafer and they are separated into chips (elements) in the manufacture thereof, as well-known.

The packaging of the pnpn heat sensitive switching device 101 is not shown in FIG. 1. Suitable packaging can be formed by the conventional assembles and it is molded with an insulator.

The characteristics of the pnpn heat sensitive switching device 101 will be illustrated.

Figure 3:
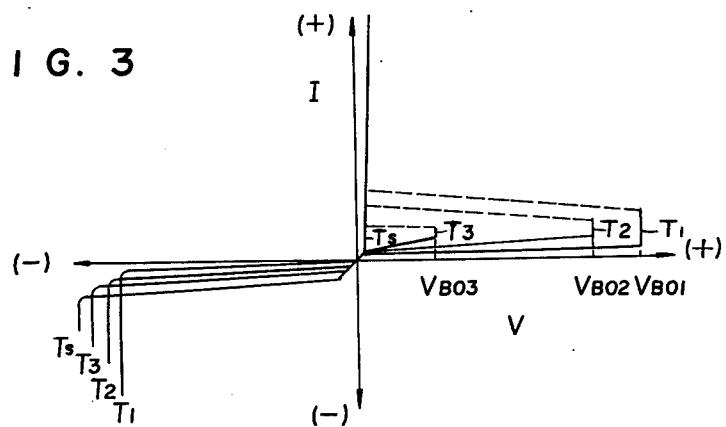
FIG. 3 is a graph showing the main voltage - main current characteristics of the pnpn heat sensitive switching device.

FIG. 3 is a graph showing the main voltage (abscissa) - main current (ordinate) characteristic of the pnpn heat sensitive switching device 101, which can be given at the temperature higher than the rated maximum temperature $T_1$ for the conventional thyristors.

The graph in the first quadrant of FIG. 3 shows the characteristic when the potential of the first main electrode 11 is higher than that of the second main electrode 14 (forward characteristic). The graph in the third quadrant of FIG. 3 shows the characteristic when the potential of the first main electrode 11 is lower than that of the third main electrode 14 (reverse characteristic).

The reverse characteristic has not the switching characteristic based on a negative resistance and is substantially the same with the reverse characteristic of the conventional rectifying diode. Accordingly, the detailed description is omitted.

With regard to the forward characteristic, the OFF voltage (blocking voltage ability) is decreased depending upon rising the junction temperature from $T_1$ to $T_2$, $T_3$ and $T_s$. The OFF state extinguishes at the temperature $T_s$ (hereinafter referring to as the switch temperature), whereby the characteristic is changed to the same as that of the rectifier. That is, it is changed from the OFF state to the ON state without the breakover.

Figure 4:
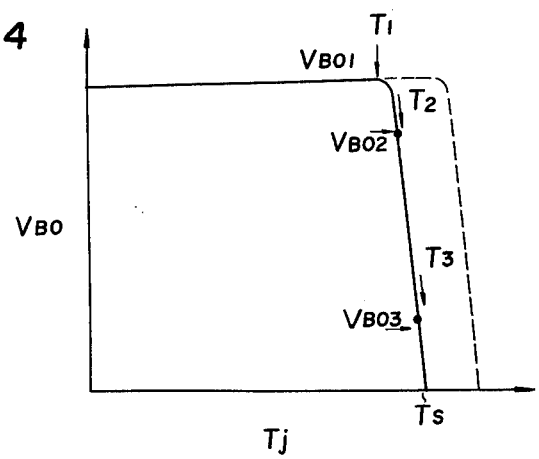
FIG. 4 is a graph showing the relationship of the junction temperature and the OFF voltage.

FIG. 4 is a graph showing the relationship of the junction temperature (abscissa) and the OFF voltage (ordinate). The full line shows the curve in the case of opening the first and second base electrodes 12, 13.

The reason why the OFF voltage is lowered depending upon rising temperature is that the space charges at the collector junction 4 are decreased by increasing the reverse current at the collector junction 4 and increasing the current amplification factor $\alpha_T$ caused by the increase of the reverse current (the sum of the current amplification factor $\alpha_{pnp}$ of the pnp transistor part wherein the junction 2 is the emitter and the junction 4 is the collector and the current amplification factor $\alpha_{npn}$ of the npn transistor part wherein the junction 6 is emitter and the junction 4 is the collector).

The relationship of the OFF voltage $V_{BO}$ and the current amplification factor $\alpha_T$ is given by the equation:

$$V_{BO} = V_{BD} \sqrt[n]{1 - \alpha_T}$$

wherein $V_{BD}$ is the avalanche breakdown voltage of the junction 4 without transistor effects and $n$ designates a constant given by the structure of the junction of the semiconductor substrate.

At $\alpha_T = 1$, the space charges for holding the collector junction 4 in the reverse bias are balanced by the carriers stored in the base layer to give zero of the OFF voltage.

In the case of the pnpn heat sensitive switching device 101 of FIG. 1, when the first and second base electrodes 12, 13 are opened, the reverse current at the collector junction 4 is fed to the first and second emitter junctions 2, 6, whereby the current amplification factor $\alpha_T$ is closely dependent upon the reverse current at the collector junction 4. Accordingly, in order to obtain the heat sensitive switching device having the characteristic for suddenly lowering the OFF voltage at relatively low temperature to extinguish the OFF state, the reverse current at the collector junction 4 is increased so as to suddenly increase the current amplification factor $\alpha_T$ at the low temperature.

The reverse current at the collector junction 4 can be considered from the viewpoints of the generative current given by the positive electron-hole pairs which is thermally generated from the recombination centers in the space charge layer, the diffusion current caused by the diffusion of the small amount of carriers from outside of the space charge layer and the leakage current on the surface.

It is not preferable to increase the leakage current on the surface (channel current and ion conductive current) because the characteristics of the heat switching device become unstable and are deteriorated.

Accordingly, in the invention, as shown in FIG. 1, the short lifetime region 8 is formed at a part of the collector junction 4 to increase the generative current and the diffusion current.

As the result, the current fed across the short lifetime region to the emitter is increased to give a high current amplification factor whereby a pnpn heat sensitive switching device which can perform the breakover at a relatively low temperature can be obtained.

The generation rate of carriers depending upon rising temperature is high because of the high density of the recombination centers, whereby the collector reverse current depending upon rising temperature is suddenly increased to be capable of remarkably increasing the current amplification factor $\alpha_T$ and suddenly decreasing the OFF voltage.

When the short lifetime region 8 is formed on all parts of the collector junction 4, the voltage drop in the ON state is increased to cause a large power loss. Accordingly, in the present invention, the short lifetime region 8 is formed only near the surface to which the recombination centers can be easily introduced.

The concentration of gold in the short lifetime region 8 can be decided depending upon the parameters for the design of the pnpn layer (the distribution of the impurity, the shape and size of the layers and the regions and the lifetime of carriers) and the switch temperature and the temperature characteristic of the OFF voltage. Usually it is necessary to increase the concentration of gold, when a low switch temperature $T_s$ is required.

It is possible to diffuse the lifetime carriers such as iron or copper instead of diffusing gold for forming the short lifetime region 8. Such metal can be diffused by the ion injection method.

In order to form the short lifetime region 8, it is possible to irradiate high energy radiation such as X-rays, $\gamma$-rays or electron rays to increase the recombination centers by forming lattice defects in the semiconductor crystals.

The ion implantation method and the high energy radiation defect method can be carried out at room temperature. Accordingly, it can be carried out after forming the electrodes, and desired pnpn heat sensitive switching devices can be prepared with small loss under testing the characteristics of the devices. The characteristics of the devices can be modified after preparing them.

Figure 2:
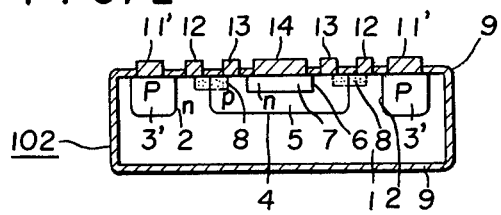
FIG. 2 is a sectional view of another embodiment of the heat sensitive switching device according to the invention.

FIG. 2 is a sectional view of another embodiment of the pnpn heat sensitive switching devices 102.

The characteristic feature of the pnpn heat sensitive switching devices 102 is to have the structure having the main electrodes on one surface side to feed the main current substantially in parallel to the main surface of the semiconductor chip.

Accordingly, when the surface having no electrode is coated with the silicon oxide membrane 9 etc. as shown in FIG. 2, even though the surface is directly contacted with the material for detecting the temperature, it is electrically insulated to provide remarkable advantages. It is also possible to coat the surface of the silicon oxide 9 with another insulator such as a glass layer, and it is also possible to fix it on a beryllia porcelain having high heat conductivity which is an electrical insulator.

In the pnpn heat sensitive switching device 102 shown in FIG. 2, the structure is substantially the same as that of the pnpn heat sensitive switching device 101 shown in FIG. 1 except for the p-type emitter layer 3' and the first main electrode 11'. The like reference numerals designate identical parts.

The p-type emitter layer 3' in FIG. 2, is formed in annular shape in the n-type base layer 1, to surround the n-type base layer 1, the p-type base layer 5 and the n-type emitter layer 7.

On the surface of the p-type emitter layer 3', the annular first main electrode 11' is brought in low resistance contact with it to surround the first base electrode 12, the second base electrode 13 and the second main electrode 14.

The short lifetime region 8 can be formed by the same method as for the heat sensitive switching device of FIG. 1. However, in the heat sensitive switching device of FIG. 2, the short lifetime region is formed between the main electrodes 11', 14 and accordingly, it is preferable to form the short lifetime region at a position shallower than those of the n-type emitter layer 7 and the p-type emitter layer 3 from the viewpoint of lowering the ON voltage.

The operation, mechanism and characteristics of the pnpn heat sensitive switching device 102 of FIG. 2 are substantially the same as those of the device of FIG. 1 and accordingly, the detailed description thereof is not recited.

The invention is not limited to the pnpn heat sensitive switching device having the unidirectional switching function, shown in FIGS. 1 and 2, but it can be a device having the pnpn layer structure or the npnpn layer structure which has the bidirectional switching function.

In the disclosed embodiment, a silicon wafer is used. However, the invention can be the pnpn heat sensitive switching device using germanium, gallium arsenide ($G_aA_s$) or gallium phosphide ($G_aP$) semiconductor.

Referring to FIG. 1, the simple heat sensitive switch circuit using the pnpn heat sensitive switching device of the invention will be illustrated.

In FIG. 1, the AC power source 20 and the load 30 and the switch 16 are connected to both ends of the main electrodes 11, 14 of the pnpn heat sensitive switching device 101. The applied voltage is selected to be sufficiently lower than the OFF voltage (breakover voltage) of the pnpn heat sensitive switching device. When the temperature of the pnpn heat sensitive switching device 101 is raised from a low temperature to the switch temperature by turning on the switch 16, the OFF voltage (breakover voltage $V_{BO}$) of the pnpn heat sensitive switching device 101 is suddenly decreased as shown in FIG. 4. When the OFF voltage becomes lower than the applied voltage, the device is changed from the OFF state to the ON state under the breakover by the power. As the result, the current is fed to the load during the positive half cycle. When the temperature reaches the switch temperature, the pnpn heat sensitive switching device has the same characteristics as those of the rectifier whereby the half-wave rectified current is fed to the load 30.

When the temperature of the pnpn heat sensitive switching device 101 is decreased after the turn-on, the OFF state is given during the period from the time for increasing the OFF voltage over the power voltage to the time for raising the temperature by the turn-off at the time passing the next zero voltage. As the result, the current is not substantially fed to the load 30.

Incidentally, the pnpn heat sensitive switching device can be brought into contact with the place or the material for detecting the temperature and the load 30 can be a lamp or relay for indicating the temperature or a gate circuit for a thyristor or an input circuit for a transistor.

The pnpn heat sensitive switching device switches by detecting the outer temperature. When the power loss of the pnpn heat sensitive switching device itself is too high, the rise of the temperature caused by the self-heating is too high, and the turn-off may be prevented even though the environmental temperature is decreased. Accordingly, it is necessary to control the ON current.

It is also preferable to use it under lowering the power voltage so as to turn-on at the temperature near the switch temperature in order to decrease the power loss at the turn-on.

When the variable resistor 15 is connected between the second main electrode and the second base electrode as shown by the dotted line in FIG. 1, the switch temperature of the pnpn heat sensitive switching device 101 is increased. When the resistance of the variable resistor is lowered, the switch temperature is raised. Accordingly, it is possible to control the temperature for turning on the pnpn heat sensitive switching device 101 by controlling the resistance of the variable resistor 15.

The graph shown by the dotted line in FIG. 4 shows the relationship of the OFF voltage and the junction temperature $T_j$ in the case of the connection of the resistance between the second main electrode 14 and the second base electrode 13 of the pnpn heat sensitive switching device 101.

The heat sensitive switching device of the invention can be widely used for various temperature controls, temperature indications, inhibitions of overheat of apparatus and delay switches.

In its applications, the heat sensitive switching device of the invention is remarkably useful because it is a non-contact switch. The circuit is simplified as it is used as both a temperature sensor and a switch. The switch temperature can be varied with a simple circuit. It can be of compact size and has high reliability as it is a semiconductor element utilizing pnpn junctions. Finally the thermal response is excellent.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent in the United States is:

1. In a heat sensitive switching device which comprises at least three pn junctions between a pair of main electrodes to change from the OFF state to the ON state under rising temperature in at least one quadrant of the main voltage - main current characteristic curve, one of the pn junctions being a forward blocking junction which causes the reverse bias in the OFF state, an improvement characterized by forming a region for shortening the lifetime of carriers at a part of the forward blocking junction.

2. A heat sensitive switching device according to claim 1 wherein said region for shortening the lifetime of carriers is formed on the surface of said forward blocking junction.

3. A heat sensitive switching device according to claim 1 wherein said region for shortening the lifetime of carriers is formed by a diffusion of a lifetime killer.

4. A heat sensitive switching device according to claim 3 wherein said lifetime killer is gold, copper or iron.

5. A heat sensitive switching device according to claim 1 wherein said region for shortening the lifetime of carriers is formed by introducing the recombination-generation center by an ion implantation method.

6. A heat sensitive switching device according to claim 1 wherein said region for shortening the lifetime of carriers is formed by irradiating high energy radiation.

7. A heat sensitive switching device according to claim 6 wherein the high energy radiation is given by at least one of X-rays, $\gamma$-rays and electron rays.

* * * * *